United States Patent [19]

Szczyrbowski et al.

[11] Patent Number: 5,126,033
[45] Date of Patent: Jun. 30, 1992

[54] PROCESS AND APPARATUS FOR REACTIVELY COATING A SUBSTRATE

[75] Inventors: Joachim Szczyrbowski, Goldbach; Stephan Roegels, Rodenbach, both of Fed. Rep. of Germany

[73] Assignee: Leybold Aktiengesellschaft, Hanau I, Fed. Rep. of Germany

[21] Appl. No.: 660,475

[22] Filed: Dec. 31, 1990

[30] Foreign Application Priority Data

Dec. 31, 1990 [DE] Fed. Rep. of Germany ....... 4042288

[51] Int. Cl.$^5$ .............................................. C23C 14/34
[52] U.S. Cl. .......................... 204/298.08; 204/192.12; 204/298.14; 204/298.19
[58] Field of Search .................. 204/192.12, 298.08, 204/298.12, 298.14, 298.19, 298.06

[56] References Cited

U.S. PATENT DOCUMENTS

| | | | |
|---|---|---|---|
| 3,887,451 | 6/1975 | Cuomo et al. | 204/192.15 X |
| 4,131,533 | 12/1978 | Bialko et al. | 204/192.12 X |
| 4,931,169 | 6/1990 | Scherer et al. | 204/298.11 |

Primary Examiner—Nam Nguyen
Attorney, Agent, or Firm—Felfe & Lynch

[57] ABSTRACT

An apparatus for the reactive coating of a substrate 1 with an electrically insulative material, for example silicon dioxide $SiO_2$, comprises a power supply source 10 connected to a cathode 5 which is disposed in an evacuable coating chamber 15, 15a and surrounds the magnets 7, 8, 9. This cathode electrically interacts with the target 3 which is sputtered and the sputtered particles thereof are deposited on the substrate 1. A process gas and a reactive gas, e.g. argon with oxygen, are introduced into the coating chamber 15, 15a. The apparatus comprises two electrodes 44, 5 which are electrically insulated from one another and from the sputtering chamber 26, wherein the one electrode is a magnetron cathode 5 where the cathode base 11 and the material of the target 3 are electrically connected to each other and the other electrode functions as an anode 44 in the plasma discharge. The DC power supply source 10 has an electrically floating output and the negative pole thereof is connected to cathode 5 and the positive pole thereof to anode 44. In order to achieve a stable coating process, a first low-induction, HF-suitable capacitor 34 is inserted between cathode 5 and anode 44 and a second low-induction, HF-suitable capacitor 35 between anode 44 and the electrically insulated vacuum chamber 25.

7 Claims, 2 Drawing Sheets

PROCESS AND APPARATUS FOR REACTIVELY COATING A SUBSTRATE

BACKGROUND OF THE INVENTION

The invention concerns an apparatus for reactively coating a substrate, with silicon dioxide ($SiO_2$) for example. It comprises a power source which is connected to an electrode disposed in an evacuable coating chamber. This electrode is electrically connected to a target which is sputtered. The sputtered particles are deposited on the substrate while a process gas and a reactive gas are supplied to the coating chamber.

In known processes for coating substrates by means of cathode sputtering where materials with a high affinity for the reactive gas are used, the problem arises that not only the substrate but also parts of the apparatus like the inner wall of the process chamber or parts of diaphragms are coated with materials of no or poor electrical conductivity. This requires a frequent change of process parameters during one single coating procedure or even a frequent interruption of the process and even a frequent cleaning or replacement of parts of the apparatus. In particular, it leads to highly undesired electric discharges (arcings).

SUMMARY OF THE INVENTION

The present invention provides an apparatus for sputtering materials with a high affinity for the reactive gas. This process should be stable and free of arcings and render a cleaning of parts superfluous. Conventional and presently existing apparatus, however, should also be suitable for this purpose without requiring essential or expensive modifications and changes. Moreover, the apparatus should operate trouble-free especially over longer periods even when insulating layers like $SiO_2$, $Al_2O_3$, $NiSi_2$-oxide, $ZrO_2$, $TiO_2$, $ZnO$ are reactively deposited.

The sputtering apparatus is provided with two electrodes which are electrically insulated from one another and from the sputtering chamber. One of the electrodes is a magnetron cathode where the cathode base and the target material are electrically connected to one another. The other electrode functions as an anode in the plasma discharge. The DC power supply (DC SSV) has an electrically floating output. The negative pole thereof is connected to the cathode and its positive pole to the anode. A first low-induction, HF-suitable capacitor is interposed between the cathode and the anode, and a second low-induction, HF-suitable capacitor is interposed between the anode and the first electrically insulated vacuum chamber.

An alternative embodiment of the invention with a annular target has a cathode which is electrically insulated from the vacuum chamber and the anode. This cathode configured as a magnetron cathode and is composed of two parts which are electrically insulated from one another. The target base inclusive of yoke and magnet is the one part. It is connected to the negative pole of a DC power supply with a capacitor being interposed. The target is the other part and it is directly connected to the power supply via a line. The cathode is connected to the anode via another capacitor, the anode in turn is connected to ground with a capacitor being interposed.

DETAILED DESCRIPTION OF THE PREFERRED EMBODIMENT

Figure 1:
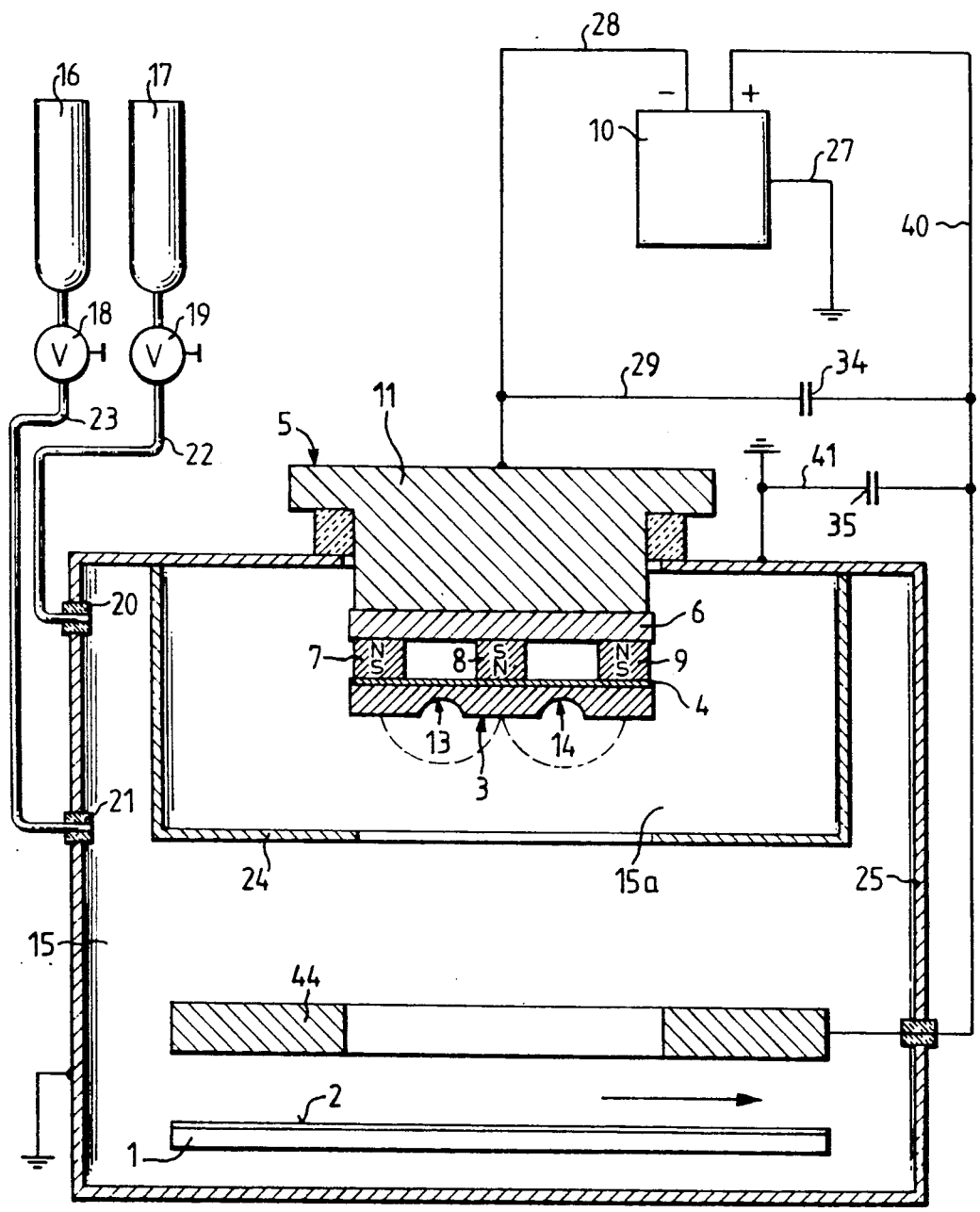
FIG. 1 is a diagrammatic section of a first embodiment of the magnetron cathode sputtering apparatus.

In FIG. 1, a substrate 1 to be coated with a thin oxide layer 2 (e.g. silicon dioxide or aluminum dioxide) is situated opposite a target 3. A plate 4 connects this target 3 to a cathode 5 which includes a base 11 and a yoke 6. Between itself and element 4, the yoke encloses magnets 7, 8, 9.

The polarities of the poles focussed onto target 3 alternate so that the south poles of the two outer magnets 7, 9 together with the north pole of the inner magnet 8 produce a magnetic field of an approximately circular arc form through the target. These magnetic fields condense the plasma in front of target 3 so that it reaches its greatest density where the magnetic fields reach their maximum values. The ions in the plasma are accelerated by an electric field generated by a direct voltage which is supplied by a direct voltage power source 10. Line 28 connects the negative pole of this DC power source 10 to electrode 5. The electric field stands perpendicularly on the surface of target 3 and accelerates the positive ions of the plasma toward this target 3. A more or less great number of atoms or particles is thus ejected from target 3, in particular from areas 13, 14. The sputtered atoms or particle travel predominantly in direction of substrate 12 where they are deposited as a thin layer 2.

In the apparatus of FIG. 1, line 28, via a branch line 29 and a capacitor 34 inserted in this line, is in addition connected to a line 40. The latter connects the positive pole of the DC power source 10 to anode 44. Another branch line 41 with a capacitor 35 inserted therein connects vacuum chamber 25 and line 40 to ground. Target 3 can be made of a material with a high affinity for the reactive gas, for example Si. During the sputtering process, this configuration and material selection, the corresponding magnetic fields and a selected ratio of oxygen to argon ensure that a layer 2 of $SiO_2$ (silicon dioxide) is produced on substrate 1.

A process computer which calculates the data measured and releases control commands is provided for the control of the represented arrangement. The values of the partial pressure measured in process chamber 15, 15a can be fed to this process computer. Based on this and other data, it can control the gas flow from cylinders 16, 17 via valves 18, 19 and also adjust the voltage at cathode 5. The process computer is also capable of controlling all other variables, e.g. the cathode current and the magnetic field strength. Since process computers of this kind are known, a description of its design is omitted here.

Figure 2:
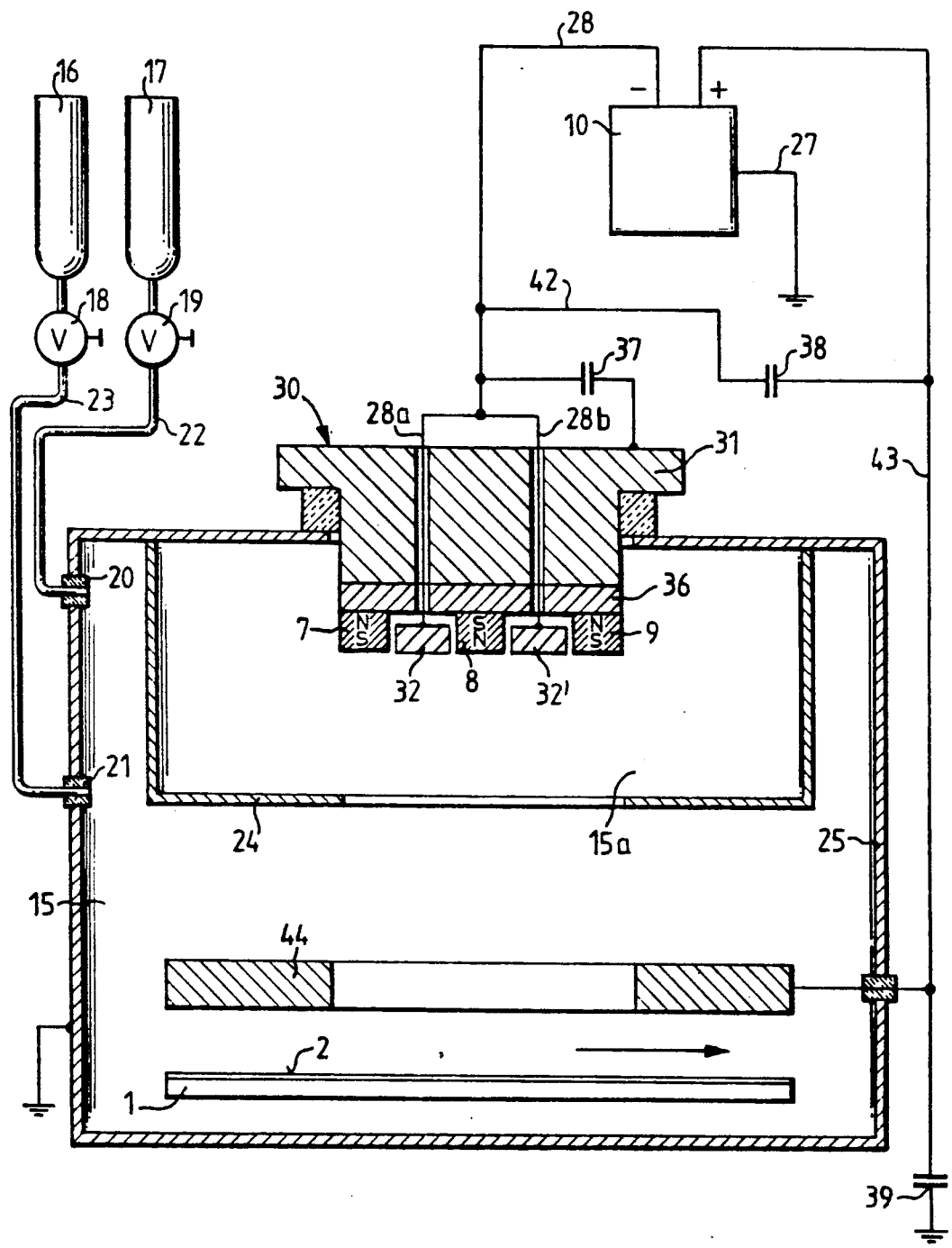
FIG. 2 is a diagrammatic section of a second embodiment of the magnetron cathode sputtering apparatus.

In the embodiment of FIG. 2, the cathode 30 includes a base 31 and a yoke 36 which supports magnets 7, 8, 9 arranged to accommodate an annular (i.e. oval) target 32, 32'. The target is connected to the negative pole of the DC power source 10 via line 28 and branch lines 28a, 28b through cathode 30. Another branch line 42, with a capacitor 38 inserted in it, is connected to line 43. The latter connects the positive pole of the DC power supply source 10 to anode 44 and which is connected to ground via a capacitor 39.

It is the purpose of capacitor 34 and/or 38 to short-circuit the high frequency oscillations as well as the current oscillations which lead to flash-overs and arcings.

Capacitor 35 and/or 39 is of particular importance for the reactive deposition of an electrically insulating layer which also grows on anode 44. A coat of an electrically insulating coat growing on the positive electrode as the sputtering time increases can significantly impair a reignition of the sputtering plasma. It is the purpose of this capacitor 35 and/or 39 to improve re-ignition of the sputtering plasma after a shut down of the SSV.

It is the purpose of capacitor 37 to eliminate the frequency of the random electric flash-overs that occur between target 32, 32' and the cathode base 31 or the yoke 36.

I claim:

1. Apparatus for the reactive coating of a substrate with electrically insulative material, comprising
   a D.C. power supply having a positive pole, a negative pole, and an electrically floating output,
   an evacuable coating chamber,
   means for introducing a process gas into said chamber,
   means for introducing a reactive gas into said chamber,
   a target of electrically conductive material,
   a magnetron cathode disposed in said chamber and electrically insulated therefrom, said cathode being connected to said negative pole of said D.C. power source and being arranged to attract electrically charged particles toward said target,
   an anode disposed in said chamber and electrically insulated therefrom, said anode being electrically connected to said positive pole, and
   first electrical connection means connecting said cathode to said anode and comprising a first capacitor between said cathode and said anode.

2. Apparatus as in claim 1 wherein said cathode is directly connected to said negative pole of said D.C. power source.

3. Apparatus as in claim 2 wherein said cathode is electrically connected to said target, said first electrical connection means further comprising said cathode.

4. Apparatus as in claim 1 further comprising second electrical connection means connecting said anode to ground and comprising a second capacitor between said anode and ground.

5. Apparatus as in claim 4 wherein said vacuum chamber is connected directly to ground.

6. Apparatus as in claim 1 wherein said first electrical connection means further comprises a third capacitor between said cathode and said negative pole of said D.C. power source.

7. Apparatus as in claim 6 wherein said target is directly connected to said negative pole of said D.C. power source, said target being electrically insulated from said cathode but for said third capacitor.

* * * * *

UNITED STATES PATENT AND TRADEMARK OFFICE
CERTIFICATE OF CORRECTION

PATENT NO. : 5,126,033
DATED : June 30, 1992
INVENTOR(S) : Joachim Szczyrbowski

It is certified that error appears in the above-identified patent and that said Letters Patent is hereby corrected as shown below:

Column 4, line 20,(Claim 5), "claim 4" should be --claim 1--.

Signed and Sealed this

Eleventh Day of January, 1994

Attest:

BRUCE LEHMAN

Attesting Officer                Commissioner of Patents and Trademarks